(12) United States Patent
Raravikar et al.

(10) Patent No.: US 9,831,206 B2
(45) Date of Patent: Nov. 28, 2017

(54) LPS SOLDER PASTE BASED LOW COST FINE PITCH POP INTERCONNECT SOLUTIONS

(71) Applicant: INTEL CORPORATION, Santa Clara, CA (US)

(72) Inventors: Nachiket R. Raravikar, Gilbert, AZ (US); James C. Matayabas, Jr., Gilbert, AZ (US); Akshay Mathkar, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/229,785

(22) Filed: Mar. 28, 2014

(65) Prior Publication Data

US 2015/0279804 A1 Oct. 1, 2015

(51) Int. Cl.
| | |
|---|---|
| H01L 23/488 | (2006.01) |
| H01L 23/00 | (2006.01) |
| H01L 25/10 | (2006.01) |
| H01L 23/498 | (2006.01) |
| H01L 23/532 | (2006.01) |
| B23K 35/22 | (2006.01) |
| H01L 23/538 | (2006.01) |
| H01L 25/00 | (2006.01) |

(52) U.S. Cl.
CPC ............ *H01L 24/17* (2013.01); *B23K 35/22* (2013.01); *H01L 23/49811* (2013.01); *H01L 23/5389* (2013.01); *H01L 25/105* (2013.01); *H01L 25/50* (2013.01); *H01L 24/16* (2013.01); *H01L 24/29* (2013.01); *H01L 24/32* (2013.01); *H01L 24/48* (2013.01); *H01L 24/73* (2013.01); *H01L 24/81* (2013.01); *H01L 24/92* (2013.01); *H01L 2224/0401* (2013.01); *H01L 2224/131* (2013.01); *H01L 2224/16225* (2013.01); *H01L 2224/16227* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01);

(Continued)

(58) Field of Classification Search
CPC ....... H01L 24/17; H01L 24/81; H01L 23/552; H01L 23/04; H01L 23/40; H01L 21/76882; H01L 2224/0383
USPC .......................................... 257/774; 438/107
See application file for complete search history.

(56) References Cited

U.S. PATENT DOCUMENTS

| | | | |
|---|---|---|---|
| 2005/0121784 A1* | 6/2005 | Standing ..................... | 257/737 |
| 2008/0158842 A1* | 7/2008 | Stiborek ............ | H01L 21/4853 361/783 |

(Continued)

*Primary Examiner* — Moazzam Hossain
(74) *Attorney, Agent, or Firm* — Schwabe Williamson & Wyatt P.C.

(57) ABSTRACT

Embodiments describe high aspect ratio and fine pitch interconnects for a semiconductor package, such as a package-on-package structure. In an embodiment, the interconnects are formed with a no-slump solder paste. In an embodiment, the no-slump solder paste is printed in an uncured state, and is then cured with a liquid phase sintering process. After being cured, the no-slump solder paste will not reflow at typical processing temperatures, such as those below approximately 400° C. According to embodiments, the no-slump solder paste includes Cu particles or spheres, a solder matrix component, a polymeric delivery vehicle, and a solvent. In an embodiment, the liquid phase sintering produces a shell of intermetallic compounds around the Cu spheres. In an embodiment, the sintering process builds a conductive metallic network through the no-slump solder paste.

8 Claims, 10 Drawing Sheets

(52) U.S. Cl.
CPC ............... *H01L 2224/73204* (2013.01); *H01L 2224/73265* (2013.01); *H01L 2224/81815* (2013.01); *H01L 2224/92125* (2013.01); *H01L 2225/0651* (2013.01); *H01L 2225/06568* (2013.01); *H01L 2225/1023* (2013.01); *H01L 2225/1058* (2013.01); *H01L 2924/014* (2013.01); *H01L 2924/12042* (2013.01); *H01L 2924/14* (2013.01); *H01L 2924/1434* (2013.01); *H01L 2924/1533* (2013.01); *H01L 2924/15311* (2013.01); *H01L 2924/181* (2013.01)

(56) References Cited

U.S. PATENT DOCUMENTS

| | | | |
|---|---|---|---|
| 2009/0014859 A1* | 1/2009 | Jeung | H01L 21/4853 257/686 |
| 2010/0291399 A1* | 11/2010 | Kato | B23K 35/025 428/553 |
| 2011/0140268 A1* | 6/2011 | Cheah | H01L 23/49833 257/737 |
| 2012/0055701 A1* | 3/2012 | Rathburn | H01R 12/57 174/254 |
| 2012/0104607 A1* | 5/2012 | Weng | H01L 21/563 257/738 |
| 2013/0082372 A1* | 4/2013 | Lin | H01L 23/36 257/686 |
| 2013/0087605 A1* | 4/2013 | Kubota | B23K 35/36 228/256 |
| 2013/0270685 A1* | 10/2013 | Yim | H01L 23/10 257/686 |
| 2014/0110153 A1* | 4/2014 | Kashiwagi | B22F 1/0074 174/251 |
| 2014/0126102 A1* | 5/2014 | Sumi | H01T 4/12 361/220 |
| 2014/0217610 A1* | 8/2014 | Jeng | H01L 23/3128 257/774 |

\* cited by examiner

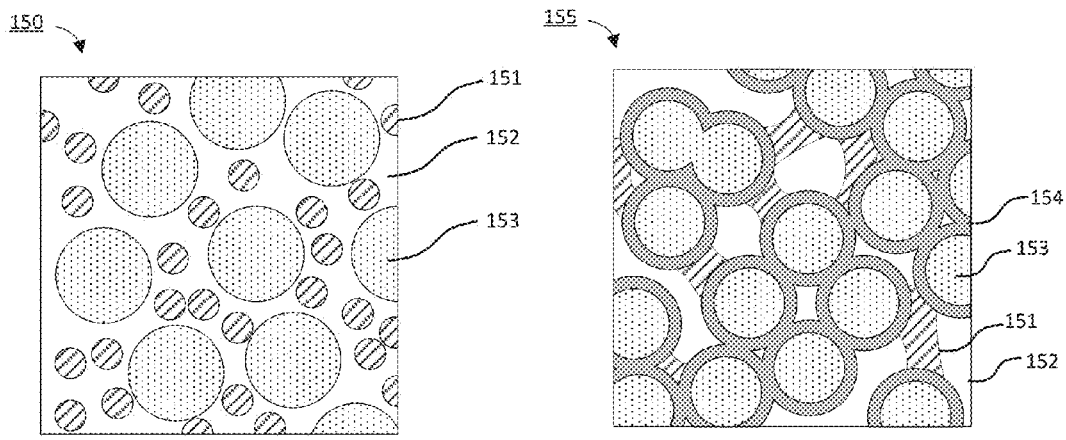
FIG. 2A  FIG. 2B
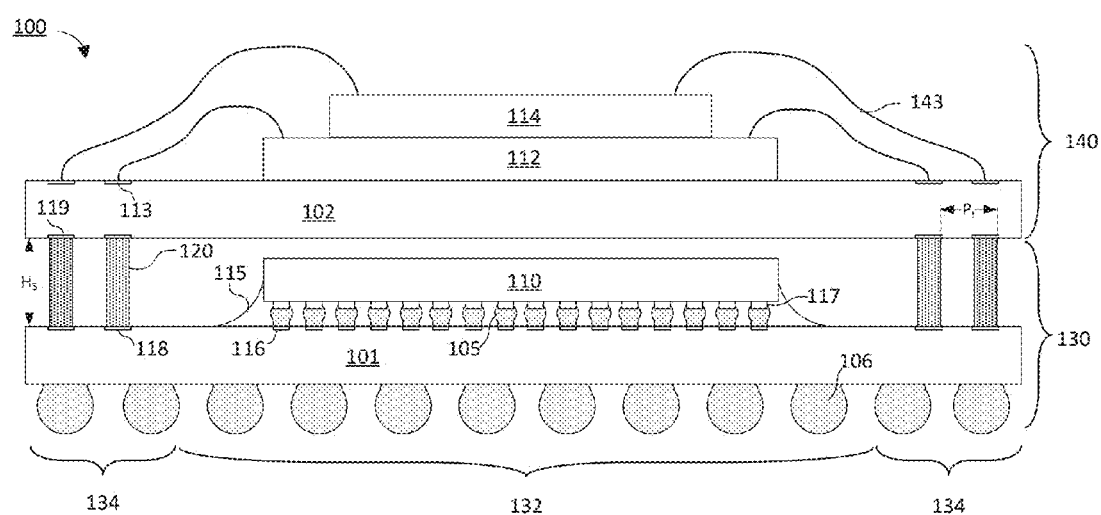
FIG. 3A

LPS SOLDER PASTE BASED LOW COST FINE PITCH POP INTERCONNECT SOLUTIONS

FIELD OF THE INVENTION

Embodiments of the present invention relate generally to the manufacture of semiconductor packages. In particular, embodiments of the present invention relate to package-on-package (PoP) structures.

BACKGROUND AND RELATED ARTS

Package-on-package (PoP) structures may include at least two device packages, with a top package 140 stacked above a bottom package 130. Each package may include one or more dies electrically coupled to a substrate. As shown in FIG. 1A, a bottom package 130 includes a first substrate 101 and a first die 110. As shown, the first die 110 may be a flip chip and may be bonded to the first substrate with an array of solder bumps 105. The top package 140 may include one or more dies, such as second and third dies 112, 114 that are electrically coupled to the second substrate 102. As shown, wires 143 may provide electrical connections from the dies 112, 114 to pads 113 on the second substrate 102. The second substrate 102 is electrically coupled to the first substrate 101 by interconnects. As shown in FIG. 1A, the interconnects are solder bumps 144. In addition to electrically coupling the second substrate 102 to the first substrate 101, the interconnects also provide the stand-off height $H_S$ that provides clearance to bond the second substrate 102 above the first die 110.

Prior art solutions for providing the desired stand-off height $H_S$ have used solder bumps 144 and through mold via drilling, as shown FIG. 1A. In package 190, solder bumps 144 are disposed over contact pads 118 on the first substrate 101. Prior to reflowing, a mold layer 165 may be formed around the solder bumps 144 to prevent the solder bumps 144 from slumping outwards and causing electrical short circuits between neighboring interconnects. Through vias 122 may then be drilled through the mold layer 165 to provide access to the solder bumps 144. However, to provide adequate stand-off heights $H_S$, the diameters of the solder bumps 144 are substantially equal to the desired height $H_S$. Accordingly, the widths of the solder bumps 144 limit the amount that the pitch $P_I$ can be reduced.

In order to reduce the pitch $P_I$, prior art PoP structures have used discrete interposes 124, such as those shown in package 191 illustrated in FIG. 1B. Discrete interposers 124 may be organic or ceramic materials, such as silicon or glass. Through vias may be formed through the interposers and metal may be disposed therein. The metal may be a copper that is deposited with an electroless plating process. The discrete interposer may then be electrically coupled and bonded to the first and second substrates 101, 102 with solder bumps 107. While the pitch $P_I$ obtainable using discrete interposers 124 is smaller than the pitch $P_I$ obtainable with solder bumps 144, the cost to produce the discrete interposers is high.

BRIEF DESCRIPTION OF THE DRAWINGS

FIGS. 2A and 2B illustrate exemplary views of the microstructure of uncured and cured no-slump solder paste, respectively, according to various embodiments.

FIGS. 3A-3F illustrate cross-sectional views of semiconductor packages according to various embodiments.

DETAILED DESCRIPTION

Figure 1A:
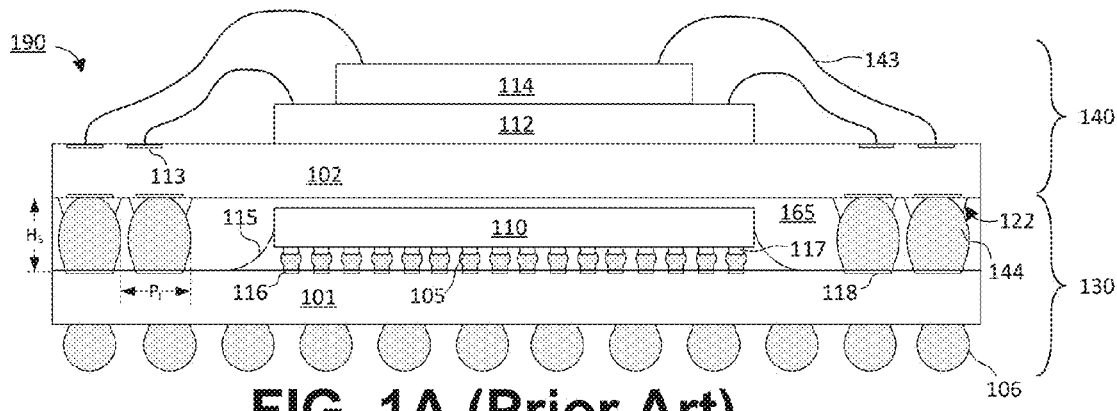
FIGS. 1A and 1B illustrate cross-sectional views of prior art semiconductor packages.
Figure 1B:
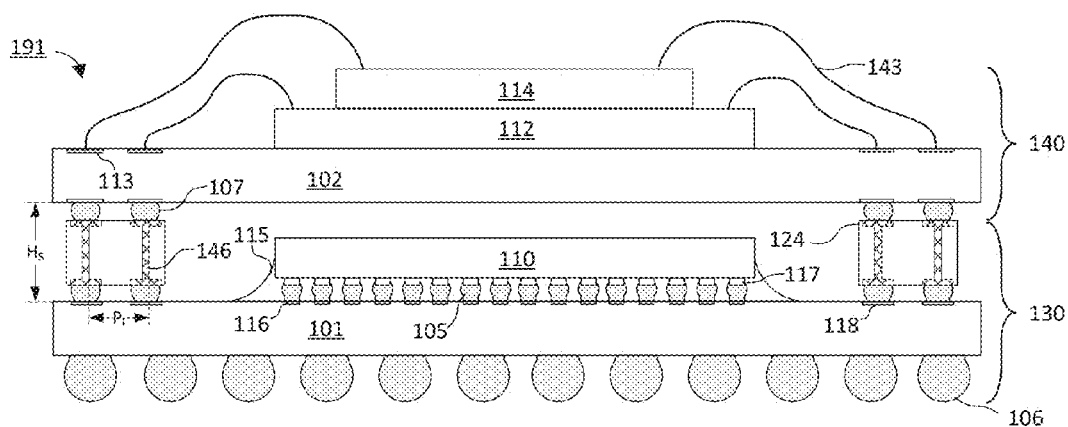

Embodiments are directed to a semiconductor package having a plurality of fine pitch interconnects with high aspect ratios that provide an adequate stand-off height $H_S$ for forming a PoP device. In such embodiments, the interconnects are made with a solder paste that does not slump after it has been deposited onto a surface. As used herein, slumping is the spreading out of the solder paste after it has been deposited onto a substrate. By way of example, a solder paste that does not slump maintains a shape substantially similar to the stencil used to print the solder paste and will not spread outwards enough to contact a neighboring interconnect after the interconnects have been formed. According to embodiments, the no-slump solder paste is curable. By way of example, once the no-slump solder paste has been cured, the reflow temperature is significantly increased, such as, for example, to a temperature greater than 400° C. As such, the cured no-slump solder paste will not reflow during subsequent processes used to form a PoP package.

Referring now to FIG. 2A, an exemplary depiction of the microstructure of an uncured no-slump solder paste 150 according to an embodiment is shown. According to an embodiment, a no-slump solder paste may include particles or spheres of a high-melting point metal 153, particles of a solder matrix 151, and a delivery vehicle 152.

According to an embodiment, the high-melting point metal 153 has a melting temperature above the reflow temperature of a typical first level interconnect (FLI) solder, such as, for example, SAC305 or SAC405. By way of example, and not by way of limitation, the high-melting point metal 153 may have a melting temperature greater than 280° C. By way of example, and not by way of limitation, the high melting point metal 153 may be particles or spheres of, SnSb-based alloys, SnZn-based alloys, copper (Cu) or its alloys, or nickel (Ni) or its alloys. According to an embodiment, the solder matrix 151 may be a low-melting point solder. In an embodiment, a low-melting point solder may be a solder that melts at a temperature below 200° C. By way of example, and not by way of limitation, a low melting point solder may be a SnBi solder, SnIn solder, SiInBi solder, or similar combinations of these and other alloys. According to an embodiment, the delivery vehicle provides the desired rheology that enables stencil printing or ink jetting. Additionally, the delivery vehicle provides the desired thixotropic properties that allows the no-slump solder paste to flow while being printed or ink jetted and remain highly viscous afterwards in order to prevent slumping. According to an embodiment, the delivery vehicle 152 may comprise a polymer or epoxy. In an embodiment, the delivery vehicle 152 may further comprise a solvent. A solvent may be used to improve the rheological and thixotropic properties of the no-slump solder paste in order to improve the printability. According to an embodiment, the delivery vehicle 152 may further comprise a flux in order to remove oxides that may be formed on of the metal components of the no-slump solder paste.

By way of example, and not by way of limitation, the uncured no-slump solder paste 150 may have a composition of approximately 10-20% (by volume) delivery vehicle 152 and approximately 80-90% (by volume) metal (including both the high-melting point metal 153 and the solder matrix 151). In an embodiment, the uncured no-slump solder paste 150 may have a composition of approximately 10% (by volume) delivery vehicle 152 and approximately 90% (by volume) metal (including both the high-melting point metal 153 and the solder matrix 151). According to an embodiment, the weight percent of the high melting-point metal 153 and the solder matrix 151 may be chosen depending on the desired current density needed for the material. By way of example, when a high current density is needed, the high-melting point metal 153 may account for approximately 50% or more of the weight of the no-slump solder paste 150. In embodiments that do not require high current densities, the solder matrix 151 may account for approximately 50% or more of the weight of the no-slump solder paste. Increasing the weight percentage of the solder matrix 151 allows for a more compliant material.

According to an embodiment, the average diameter of the particles of the high-melting point metal 153 is approximately one-third or less of the width of the stencil opening used to print the no-slump solder paste 150. In an embodiment, the average diameter of the particles of the high-melting point metal 153 is approximately one-fourth or less of the width of the stencil opening used to print the no-slump solder paste 150. In an embodiment, the average diameter of the particles of the high-melting point metal 153 is approximately one-tenth or less of the width of the stencil opening used to print the no-slump solder paste 150. By way of example, and not by way of limitation, the diameter of the particles of the high-melting point metal 153 may be less than approximately 50 µm. By way of example, and not by way of limitation, the diameter of the particles of the high-melting point metal 153 may be less than approximately 10 µm.

According to an embodiment, the portion of the delivery vehicle 152 that is epoxy or polymer may account for between 6-12% (by volume) of the uncured no-slump solder paste 150 and the portion of the delivery vehicle 152 that is solvent may account for 4-8% (by volume) of the uncured no-slump solder paste 150. In an embodiment, the epoxy may account for approximately 6% (by volume) of the uncured no-slump solder paste 150 and the solvent may account for approximately 4% (by volume) of the uncured no-slump solder paste 150. As shown in FIG. 2A, the delivery vehicle 152 wets the metallic components and provides support to the uncured no-slump solder paste 150 to prevent slumping.

Referring now to FIG. 2B, an exemplary depiction of the microstructure of a cured no-slump solder paste 155 according to an embodiment is shown. By way of example, and not by way of limitation, the cured no-slump solder paste 155 may have a composition between approximately 5-15% (by volume) delivery vehicle 152 and between approximately 85-95% (by volume) metal (including the high-melting point metal 153, the solder matrix 151, and intermetallic compounds 154 formed during the curing process). In an embodiment, the cured no-slump solder paste 155 may have a composition of approximately 6% (by volume) delivery vehicle 152 and approximately 94% (by volume) metal (including the high-melting point metal 153, the solder matrix 151, and intermetallic compounds 154). According to an embodiment, the reduction in the volume percentage of the delivery vehicle 152 of the cured no-slump solder paste 155 is the result of the solvent portion of the delivery vehicle 152 being burned off during the curing process.

As shown in FIG. 2B, the cured no-slump solder paste 155 forms a conductive network with portions of the solder matrix 151 having melted and solidified to form conductive bridges between the high melting point metal particles 153. Additionally, the curing process has produced an intermetallic compound shell 154 around the surfaces of the high-melting point particles 153. According to an embodiment, the conductive network may also include portions of intermetallic compound shells 154 that have sintered together through solid-state diffusion bonding. According to an embodiment, the high-melting point particles 153 may also undergo solid-state diffusion bonding with intermetallic compound shells 154 to form a portion of the conductive network. According to an embodiment, the high-melting point particles 153 may sinter together with solid-state diffusion bonding to form a portion of the conductive network. According to an embodiment, the cured no-slump solder paste 155 has a high reflow temperature, such as, for example, greater than 400° C.

In embodiments with low melting point solders, the curing process may include a liquid phase sintering process. In such embodiments, the curing process may first include removing the solvent. By way of example, and not by way of limitation, the solvent may be removed by holding the temperature between approximately 115° C. and 120° C. for approximately 20 minutes. According to an embodiment, the flux may also remove oxides from metallic surfaces during the first temperature hold. Thereafter, the temperature may be ramped up to between 200° C. and 250° C. In an exemplary embodiment including a SnBi solder matrix 151 and Cu particles 153, the SnBi solder matrix melts at temperatures between approximately 145° C. and 190° C. The liquid phases of the Sn and Bi and the solid Cu particles 153 are suspended in the polymer resin 152. The liquid phase Sn and Bi may also wet the surfaces of the Cu particles 153. At temperatures between approximately 200° C. and 250° C., the liquid Sn begins to sinter with the surfaces of the Cu particles 153. The liquid phase sintering produces an intermetallic compound shell 154 around the Cu particles 153. In an embodiment, the intermetallic compounds may include $Cu_6Sn_5$, $Cu_3Sn$, $Cu_3Sn_8$, and/or $Cu_4Sn$. These intermetallic compounds each have melting temperatures above approximately 400° C. According to an embodiment, the temperature ramp may also induce cross-linking in the polymer. According to an embodiment, the polymer may also entrap any remaining flux residue or flux bi-products, and therefore, there is no flux cleaning process required after the curing process.

When the solder matrix 151 has liquefied, chemical incompatibility between the components of the no-slump solder paste 150 may cause the delivery vehicle 152 to be extruded around the liquefied solder matrix 151. The intensity of such an extrusion event is reduced by reducing the volume percentage of the polymer or epoxy component of the no-slump solder paste. For example, extrusion of the delivery vehicle 152 around the liquefied solder matrix 151 will not prevent liquid phase sintering when the volume percentage of the polymer or epoxy component of the no-slump solder paste is below approximately 15%.

According to additional embodiments, portions of the liquid Bi may also sinter with the solid Cu particles 153 to form intermetallic compounds comprising Cu, Sn, and Bi. Additionally, the sintering of liquid Sn with the Cu particles 153 reduces the Sn content in the liquefied solder matrix 151. Accordingly, the melting temperature of the remaining unsintered solder matrix 151 is increased towards the melting temperature of pure Bi, which is 271.5° C. According to an embodiment, substantially all of the solder matrix 151 may be consumed during the curing process.

According to an embodiment, a sufficient amount of liquid phase sintering is obtained when the temperature is held at 210° C. for approximately 15 minutes. According to additional embodiments, higher temperatures may be used with a lower hold length. In an embodiment, the sintering temperature may be below 200° C. when longer hold times are used. By way of example and not by way of limitation a 60 minute hold at approximately 190° C. or a 120 minute hold at approximately 165° C. are sufficient to form Cu—Sn intermetallic compounds 154. Once the no-slump solder paste has been cured, the solder paste 155 will not reflow during subsequent packaging processes due to the increase in the melting temperature that results from the formation of intermetallic compounds 154 and the reduction of the Sn content in the SnBi solder matrix 151. According to an embodiment, the remaining Bi-heavy solder matrix may melt at elevated temperatures, however, due to the presence of Cu particles 153 with Cu—Sn intermetallic compound shells 154 and the remaining polymer matrix 152, the cured no-slump solder paste 155 will substantially maintain its shape and not slump. By way of example, and not by way of limitation, when a no-slump solder paste 155 is formed into interconnect columns having a pitch between 200 μm and 350 μm, widths between 100 μm and 200 μm, and stand-off heights between 130 and 300 μm, the widths of the interconnects will not extend outwards (i.e., slump) enough to contact neighboring interconnects. According to an embodiment, the dimensional change of the width of a no-slump solder paste 155 interconnect is less than 1%. After curing, the Cu particles 153 with Cu—Sn intermetallic compound shells 154, and the remaining Bi-heavy solder matrix 151 form a continuous conductive network through the solder paste 155. By way of example, and not by way of limitation, the cured no-slump solder paste 155 has resistance of approximately 50 μΩ/cm.

According to additional embodiments, the solder matrix may comprise a higher melting temperature solder, such as, for example, SnAgCu (SAC), SnSb, or SnCu. In such embodiments, the solder matrix melts at higher temperatures, such as those above approximately 215° C. However, once the solder matrix has liquefied, the liquid sintering and formation of intermetallic compounds is substantially similar to the process described above with low-melting point solder matrices such as SnBi. According to an additional embodiment, the temperature may be maintained below the melting temperature of the high melting temperature solder. In such embodiments, the curing process may be driven by solid state diffusion.

According to an embodiment, the no-slump solder paste 150 may include a high temperature solder matrix 151 and delivery vehicle 152 comprising an epoxy or polymeric material and a fluxing agent. According to an additional embodiment, the no-slump solder paste 150 may include a high temperature solder matrix 151 and a delivery vehicle 152 including flux, thixotropic agents, and thickeners. In such embodiments, a polymer or epoxy component of the delivery vehicle 152 is not needed because the flux, thixotropic agents, and thickeners are able to provide a high enough viscosity and thixotropic index to prevent slumping. Embodiments without a polymer or epoxy component may also (optionally) include high-melting point metal particles 153. According to embodiments, the electrical resistance of the no-slump solder pastes 150 is lower in embodiments without a polymer or epoxy based delivery vehicle.

According to embodiments, no-slump solder pastes, such as those described above, may be used to form fine pitch interconnects 120. The no-slump solder pastes may be deposited in various configurations as shown in FIGS. 3A-3F.

Referring now to FIG. 3A, a semiconductor package 100 having interconnects 120 with the desired stand-off height $H_S$ is shown. According to an embodiment, semiconductor package 100 is formed on a first substrate 101. First substrate 101 may include one or more laminated layers with conductive circuitry to form a build-up structure. The first substrate 101 may have solder bumps 106 formed on a bottom surface to provide electrical connections to a lower packaging layer, such as a printed circuit board (not shown). A first plurality of contact pads 116 are formed on the surface of the first substrate 101 on an interior portion 132 of the substrate 101. A second plurality of contact pads 118 are formed on the surface of the first substrate on a peripheral portion 134 of the first substrate 101. The first and second contact pads may be formed from materials typically used for conductive pads. By way of example, and not by way of limitation, the first and second contact pads 116, 118 may be Cu, Ni, or NiAg. According to an additional embodiment, the first and second contact pads 116, 118 may also include an organic surface protection (OSP) layer. According to an embodiment, the OSP layer may burn off during a reflowing or curing process.

A first die 110 may be bonded and electrically coupled to the first contact pads 116. By way of example, the first die may be an integrated circuit (IC) such as a microprocessor. As shown in FIG. 3A, the first die utilizes a controlled collapse chip connection (C4) or a flip chip electrical connection method. According to additional embodiments, alternative electrical connection methods may be used such as, for example, wire bonding. The first die 110 has a plurality of bonding pads 117. A solder bump 105 may be formed on each of the bonding pads 117. As shown, an insulative underfill material 115 may be formed around the solder bumps 105 after they have been reflown. By way of example, the underfill material 115 may be an epoxy material, as is known in the art.

Semiconductor package 100 has a plurality of high aspect ratio interconnects 120 formed on the second contact pads 118 in the peripheral portion 134 of the first substrate 101. The interconnects 120 comprise a cured no-slump solder paste 155 substantially similar to ones described above. Accordingly, the interconnects 120 may have a high aspect ratio, such as approximately 2:1 or greater. According to an embodiment, the height of the interconnects 120 is chosen such that they provide the desired stand-off height $H_S$ needed to provide clearance for bonding an upper package 140 above the bottom package 130. According to an embodiment, the interconnects 120 may have a height greater than 300 μm. According to an additional embodiment, the height of the interconnects is approximately 400 μm or greater. In an embodiment, the widths of the interconnects 120 may be 200 μm or less. In an embodiment, the widths of the interconnects 120 may be 100 μm or less. In an embodiment, the pitch $P_I$ of the interconnects 120 may be approximately 0.4 mm or less. By way of example, and not by way of limitation, the pitch $P_I$ of the interconnects 120 may be approximately 0.2 mm or less. Furthermore, the high aspect ratio interconnects 120 may be formed without lateral supports, such as a mold layer. Accordingly, embodiments may be formed with fewer processing operations than the prior art PoP structures.

Interconnects 120 formed with no-slump solder paste may be cured with a process substantially similar to that described above. According to an embodiment, the curing process also promotes improved adhesion to the second contact pads 118. By way of example, the liquid phase sintering described above also occurs between the contact pads 118 and the liquefied solder matrix 151 during the curing process. In such embodiments, the liquefied solder matrix 151 coats portions of the contact pad 118 and forms intermetallic compounds during the curing process. In an embodiment, the polymer component 152 of the no-slump solder paste also improves the adhesion of the interconnects 120 to the second contact pads 118.

As shown in FIG. 3A, top surfaces of interconnects 120 are bonded to bonding pads 119 formed on a bottom surface of an upper package 140. Upper package 140 may include a second substrate 102. The second substrate may also be formed with one or more laminated layers with conductive circuitry to form a build-up layer. The conductive circuitry in the second substrate 102 may electrically couple the bonding pads 119 to contact pads 113 on the top surface of the second substrate 102. Wires 143 may provide electrical connections from contact pads 113 to the one or more dies 112 and 114 bonded to the second substrate. By way of example, and not by way of limitation, dies 112 and 114 may be memory devices.

Figure 3B:
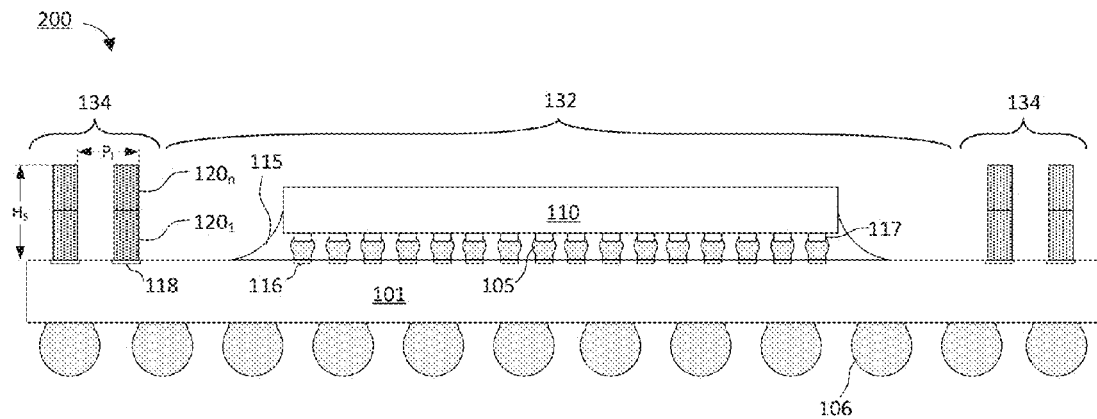

Referring now to FIG. 3B, a semiconductor package 200 according to an additional embodiment is shown. Semiconductor package 200 is substantially similar to semiconductor package 100, with the exception that the interconnects are formed with a plurality of shorter interconnect portions $120_1$ through $120_n$ stacked on top of each other. As shown in FIG. 3B, there are two interconnect portions $120_1$ and $120_n$ stacked on top of each other to provide the desired stand-off height $H_S$. However, additional embodiments are not so limited, and may include three or more stacked interconnect portions.

According to an embodiment, each of the interconnect portions $120_1$ through $120_n$ may be an equal height, as shown in FIG. 3B. By way of example, and not by way of limitation, a first interconnect portion $120_1$ and a second interconnect portion $120_2$ may each have a height of 200 µm. In an additional embodiment, the interconnect portions $120_1$ through $120_n$ may be unequal in height. By way of example, and not by way of limitation, a first interconnect portion $120_1$ may have a height equal to three-quarters of the stand-off height $H_S$ and a second interconnect portion $120_2$ may have a height equal to one-quarter of the stand-off height $H_S$. By way of example, and not by way of limitation, the first interconnect portion $120_1$ may have a height of 300 µm and the second interconnect portion $120_2$ may have a height of 100 µm. According to an additional embodiment in which there are three or more interconnect portions, two or more of interconnect portions may be an equal height. By way of example, and not by way of limitation, a first interconnect portion $120_1$ may have a height of 150 µm, and second and third interconnect portions $120_2$, $120_3$ may each have a height of 50 µm. Though not shown, an upper package 140 may be bonded to the top surfaces of the uppermost interconnect portion $120_n$ in substantially the same arrangement shown in FIG. 3A.

Figure 3C:
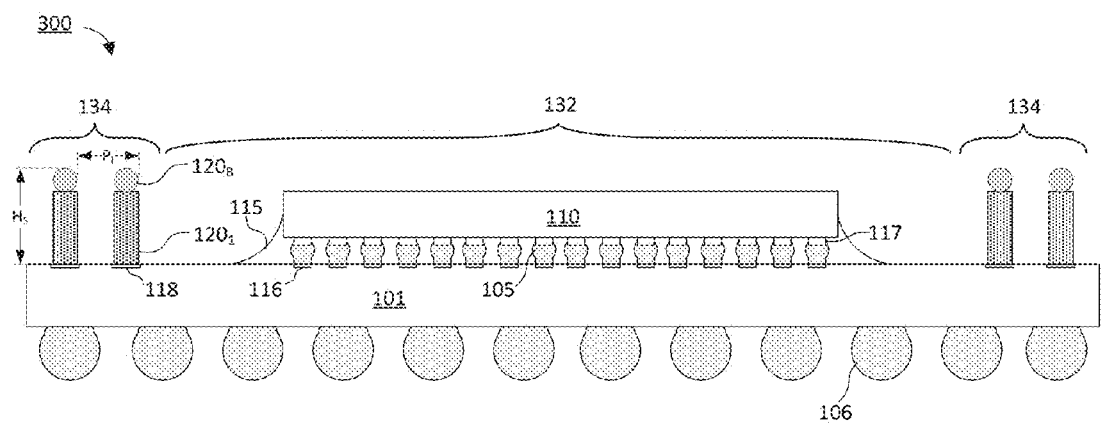
Figure 3D:
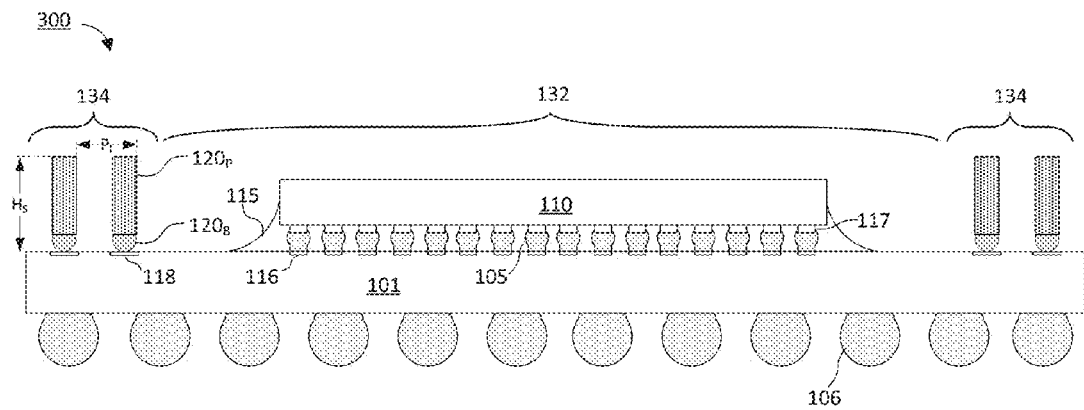

Referring now to FIG. 3C, a semiconductor package 300 according to an additional embodiment is shown. Semiconductor package 300 is substantially similar to semiconductor package 200, with the exception that at least one of the interconnect portions $120_1$ through $120_n$ is not formed with a no-slump solder paste. As shown in FIG. 3C, a first interconnect portion $120_1$ is formed with a no-slump solder paste, and a second interconnect portion $120_B$ is formed with a solder bump. By way of example, and not by way of limitation, the solder bump may be a high melting temperature solder such as SnSb. In such embodiments, the limitations of using a solder bump to form the interconnects 120 described above with respect to the prior art package of FIG. 1A are not present. In the prior art, the solder bump accounted for the complete stand-off height $H_S$. As such, the diameter of the solder bumps needed to be substantially equal to the stand-off height $H_S$. This severely limits the extent to which the pitch of the interconnects $P_I$ could be scaled down in the prior art. Here, solder bump portions $120_B$ only supply a portion of the stand-off height $H_S$ and therefore, the diameter of the solder bump portions $120_B$ can be reduced. By way of example, and not by way of limitation, the diameter of the solder bump portions $120_B$ may be approximately 150 µm or less. This allows for the pitch $P_I$ of the interconnects 120 to be reduced. By way of example, and not by way of limitation, the pitch $P_I$ is less than 0.3 mm. Furthermore, due to the reduction in the diameter of the solder bump portions $120_B$, no sidewall support is needed to prevent shorting with neighboring interconnects 120. Though not shown, an upper package 140 may be bonded to the top surfaces of the uppermost interconnect portion in substantially the same arrangement shown in FIG. 3A.

Though semiconductor package 300 is shown with only one no-slump solder paste interconnect portion $120_1$, it is noted that embodiments also include the use of a plurality of no-slump solder paste portions $120_1$ through $120_n$, as described above with respect to FIG. 3B. In such embodiments, two or more interconnect portions may be stacked with a solder bump portion $120_B$ formed on the top surface of the uppermost no-slump solder paste portion $120_n$. According to an embodiment, the one or more no-slump solder paste interconnect portions may be cured prior to forming the solder bump portion $120_B$ of the interconnects 120. Alternatively, the solder bump portion $120_B$ may be formed prior to curing the no-slump solder paste portions of the interconnects 120. According to an additional embodiment, shown in FIG. 3D, a substantially similar package 300 may be formed in which the solder bump portion $120_B$ of the interconnects 120 is formed on the surface of the second contact pads 118. The no-slump solder paste portions $120_1$ through $120_n$ are then formed on the top surface of the solder bump portion $120_B$. Though not shown, an upper package 140 may be bonded to the top surfaces of the uppermost interconnect portion in substantially the same arrangement shown in FIG. 3A.

Figure 3E:
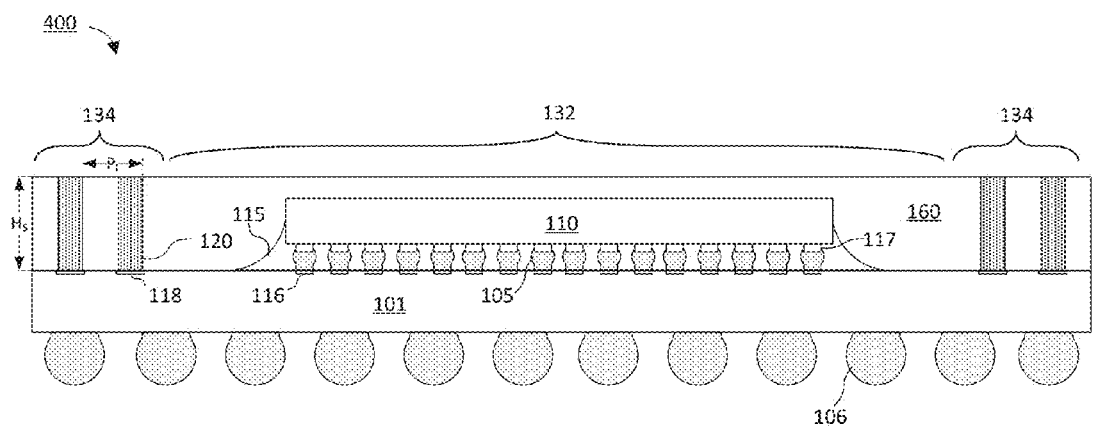

Referring now to FIG. 3E, a semiconductor package 400 according to an additional embodiment is shown. Semiconductor package 400 is substantially similar to semiconductor package 100, with the exception that the interconnects 120 are formed through a mold layer 160. The use of a mold layer 160 allows for even further reduced pitch $P_I$. By way of example, and not by way of limitation, forming the interconnects through a via in the mold layer 160 allows for formation of interconnects 120 with a pitch of approximately 0.1 mm or less. According to an embodiment, the mold layer 160 may be an epoxy layer. By way of example, the mold layer 160 may be approximately equal to the stand-off height $H_S$. By way of example, and not by way of limitation, the mold layer 160 may be between approximately 250 μm and 400 μm thick. According to an additional embodiment, the mold layer 160 may be greater than approximately 400 μm thick. Through vias are formed in the molded layer 160 and no-slump solder paste is disposed therein to form interconnects 120. The additional lateral support provided by the mold layer 160 allows for even higher aspect ratio interconnects 120, such as 3:1 or greater. By way of example, and not by way of limitation, the stand-off height $H_S$ of the interconnects 120 may be approximately 300 μm and the width of the interconnects 120 may be approximately 80 μm. According to an additional embodiment, the no-slump solder paste may only fill a portion of the via. In such embodiments, the remainder of the via may be filled with a solder bump. By way of example, and not by way of limitation, the solder bump may be a high temperature solder, such as SnSb. Though not shown, an upper package 140 may be bonded to the top surfaces of the interconnects 120 in substantially the same arrangement shown in FIG. 3A. Additionally, the mold layer 160 may provide additional support for the upper package 140.

Figure 3F:
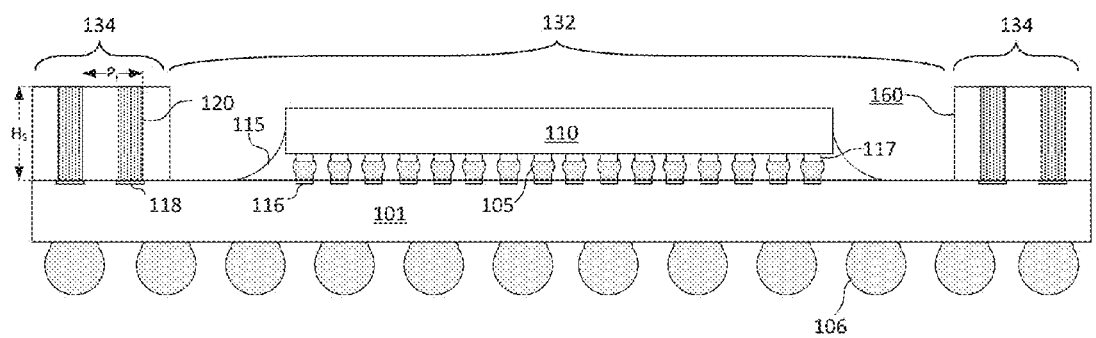

Referring now to FIG. 3F, a semiconductor package 500 according to an additional embodiment is shown. Semiconductor package 500 is substantially similar to semiconductor package 400, with the exception that mold layer 160 is selectively formed over the peripheral region 134 of the first substrate 101. According to an embodiment, mold layer 160 and interconnects 120 may be a discrete interposer. In such embodiments, the discrete interposer may include no-slump solder paste in the uncured state. After the discrete interposer is placed on the first substrate 101, the no-slump solder paste may be cured. Since the interconnect is formed with a solder paste, no additional solder bumping is needed to bond the interposer to the substrate. The curing process will allow the interconnect to form a conductive and mechanical bond with the bond pad. Though not shown, an upper package 140 may be bonded to the top surfaces of the interconnects 120 in substantially the same arrangement shown in FIG. 3A. Additionally, the mold layer 160 may provide additional support for the upper package 140.

According to embodiments, semiconductor packages having high aspect ratio interconnects 120 with reduced pitch $P_I$, such as those described above with respect to FIGS. 3A-3F, may be formed with one or more of the following processes.

According to an embodiment, a semiconductor package 100, as described above with respect to FIG. 3A, may be formed according to a die-attach first process as shown in FIGS. 4A-4D.

Figure 4A:
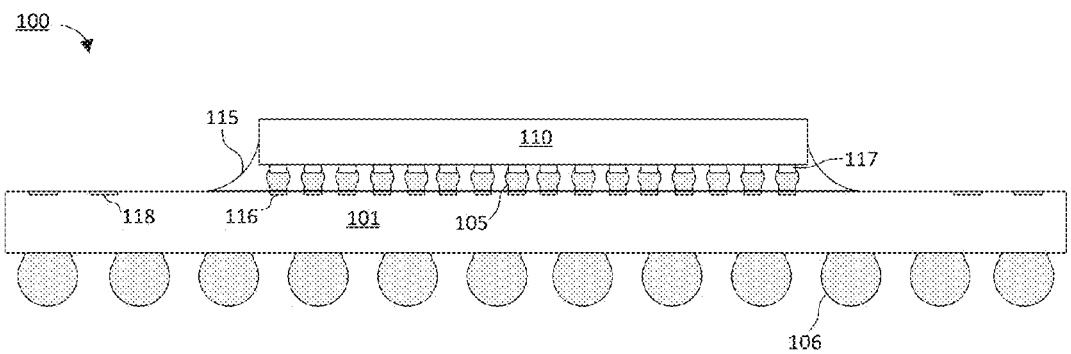
FIGS. 4A-4D illustrate cross-sectional views of a process for forming a semiconductor package according to various embodiments.

Referring now to FIG. 4A, a first substrate 101 is provided. In the die-attach first process, a first device die 110 is bonded and electrically coupled to first contact pads 116 on the first substrate 101. A first die 110 may be bonded and electrically coupled to the first contact pads 116. By way of example, the first die 110 may be an integrated circuit (IC) such as a microprocessor. As shown in FIG. 4A, the first die 110 utilizes a flip chip electrical connection method. According to additional embodiments, alternative electrical connection methods such as, for example, wire bonding, may be used. The first die 110 may have a plurality of bonding pads 117. A solder bump 105 may be formed on each of the bonding pads 117. According to an embodiment, the first die 110 is bonded to the first substrate with a thermocompression bonding (TCB) process that involves reflowing the solder bumps 105 after the bumps have been placed in contact with the first contact pads 116. As shown, an insulative underfill material 115 may be deposited around the solder bumps 105 after they have been reflown. By way of example, the underfill material 115 may be an epoxy material, as is known in the art.

Figure 4B:
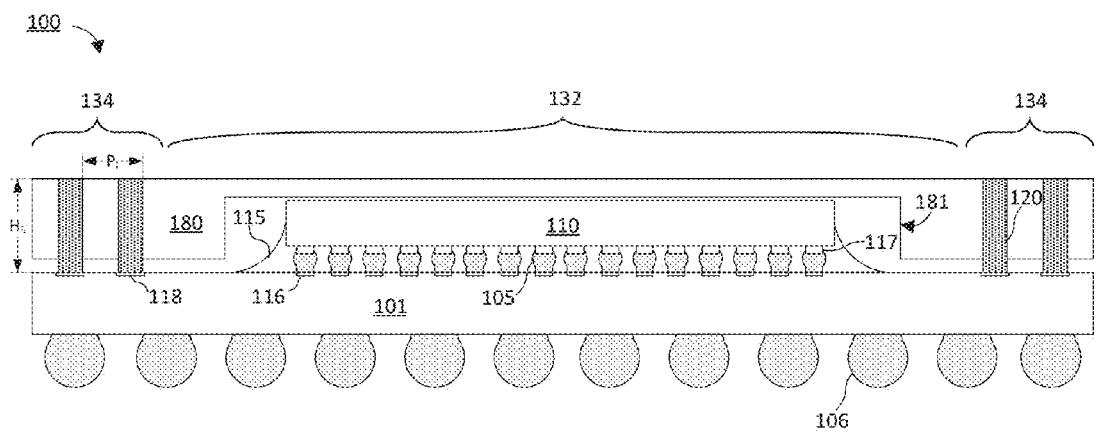

Referring now to FIG. 4B, the interconnects 120 may be formed on the second pads 118 with a stencil printing process. In an embodiment, a deep stencil 180 may be used. By way of example, and not by way of limitation, the stencil is as thick as the stand-off height $H_S$. According to an embodiment, the stencil 180 may have a thickness slightly smaller than the stand-off height. In an embodiment, a deep stencil may be greater than 200 μm thick. By way of example, and not by way of limitation, the stencil may be a stainless steel stencil. In order to provide sufficient fill of the stencil, a pressure head may be used. Since the interconnects 120 are formed in a peripheral region 134, the increased pressure will not damage the first die 110. According to an embodiment, the printing process may be implemented with a gap between the bottom surface of the stencil and the top surface of the first substrate 101. Due to the rheological and thixotropic properties of the no-slump solder paste, the portion of the interconnect 120 formed below the stencil 180 will not slump and cause a short between a neighboring interconnect. According to an additional embodiment, the stencil may be in contact with the first substrate 101 during printing. According to an embodiment, stencil 180 may have a recessed portion 181 to provide clearance for the attached first die 110. In an additional embodiment, the stencil may only cover the peripheral portion 134 of the first substrate 101. According to an embodiment, stencil 180 has substantially vertical sidewalls with a uniform cross-section. In an additional embodiment, stencil 180 may have non-vertical sidewalls with the bottom opening being larger than the top opening. In such embodiments, the tapered sidewalls may improve the ease with which the stencil can be removed after printing.

Figure 4C:
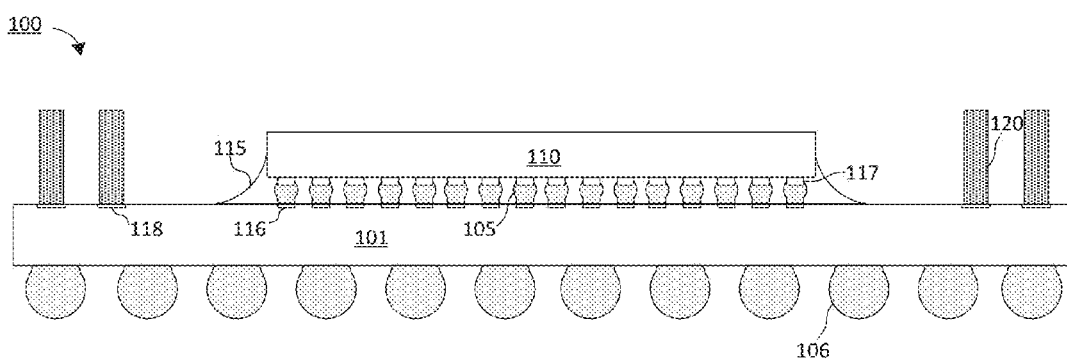

After the interconnects 120 have been printed, the stencil is removed, as shown in FIG. 4C. At this point, the interconnects 120 are still in an uncured state. However, due to the composition of the no-slump solder paste and its desirable rheological and thixotropic properties, it will not slump and create shorts between neighboring interconnects 120. Prior to bonding the upper package to the interconnects 120, the no-slump solder paste is cured with a curing process substantially similar to those described above. In an embodiment, the curing process may comprise a solvent removal process. By way of example, and not by way of limitation, the solvent may be burned off at a temperature between approximately 110° C. and 120° C. held for approximately 20 minutes. Thereafter, a temperature ramp to the sintering temperature is made. According to an embodiment that utilizes a liquid phase sintering process, the solder matrix 151, such as SnBi, will melt between 145° C. and 190° C. While the solder matrix 151 is melting, the polymer 152 provides structural support and prevents slumping that could create a short circuit between neighboring interconnects 120. Liquid phase sintering may then occur at temperatures between 200° C. and 250° C. By way of example, and not by way of limitation, the temperature may be held at approximately 210° C. for 15 minutes. As described above, the liquid Sn sinters with the Cu particles 153 to form an intermetallic compound shell 154 around the Cu particles 153. After the curing process, the melting temperature of the no-slump solder paste is increased, and it will not reflow when brought through the same temperature range during subsequent processing.

Figure 4D:
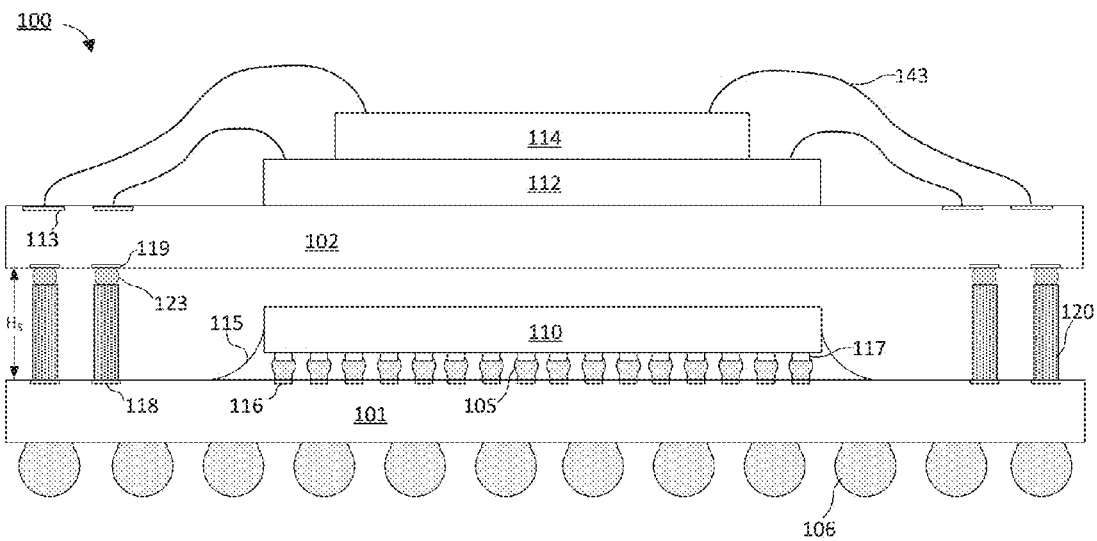

After the interconnects 120 have been cured, an upper package 140 may be mounted to the top surfaces of the interconnects 120. As shown in FIG. 4D, upper package 140 may include a second substrate 102. The second substrate 102 may be formed with one or more laminated layers with conductive circuitry to form a build-up layer. The conductive circuitry in the second substrate 102 may electrically couple bonding pads 119 to contact pads 113. Wires 143 may provide electrical connections from contact pads 113 to the one or more dies 112 and 114 bonded to the second substrate. By way of example, and not by way of limitation, dies 112 and 114 may be memory devices. According to an embodiment, the one or more dies may be attached subsequent to the second substrate 102 being bonded to the interconnects 120. According to an embodiment, the second substrate 102 may have solder bumps 123 with a fluxing agent formed on the bonding pads 119. During the bonding process, solder bumps 123 reflow with molten solder diffusing into the top surface of the interconnects 120 to form a metallurgical joint. Accordingly, solder bumps 123 may provide additional stand-off height $H_S$ to the interconnects 120.

Figure 5A:
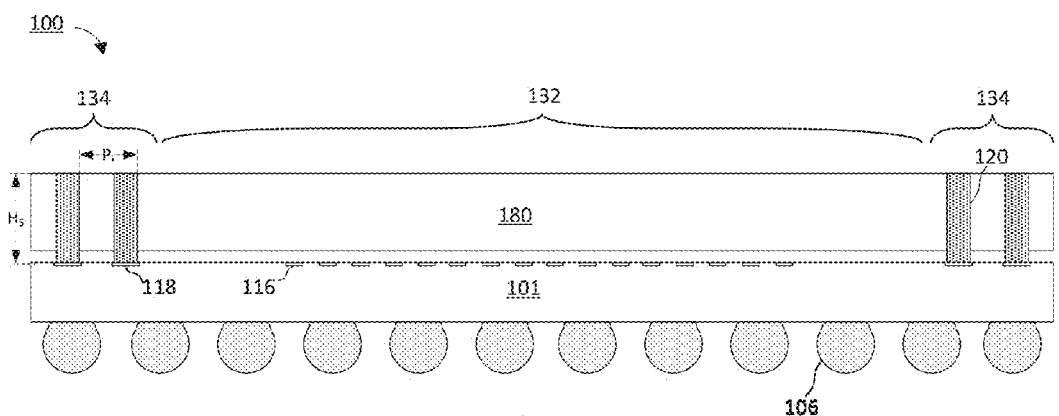
FIGS. 5A-5C illustrate cross-sectional views of a process for forming a semiconductor package according to various embodiments.
Figure 5B:
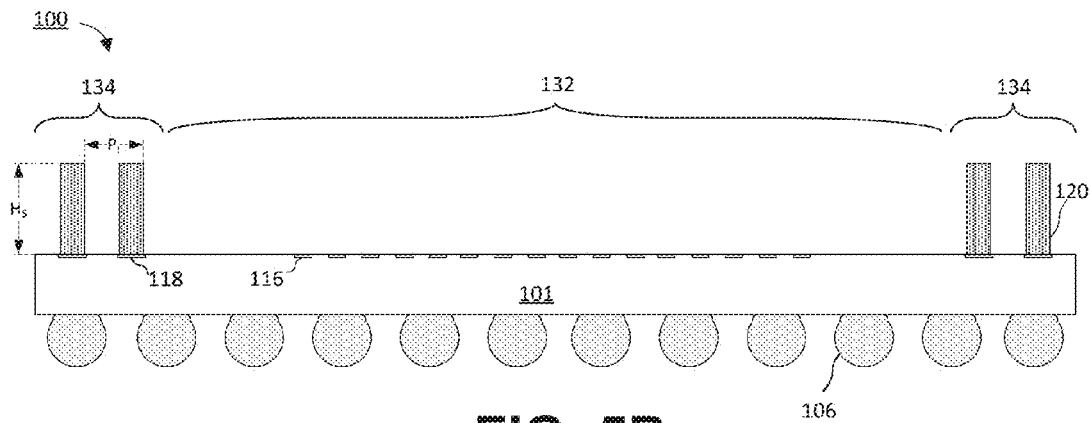
Figure 5C:
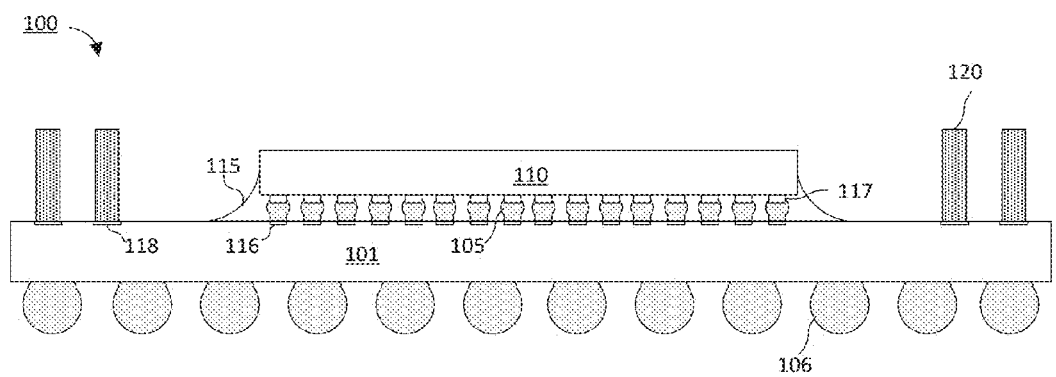

According to an additional embodiment, the interconnects 120 may be formed on the first substrate 101 prior to attaching the first die 110 to the first substrate 101, as shown in FIGS. 5A-5C. Referring now to FIG. 5A, a substrate 101 having first contact pads 116 and second contact pads 118 is provided. Substrate 101 is substantially similar to substrate 101 described above with respect to FIG. 4A, and as such, a description will not be repeated here. According to an embodiment, interconnects 120 are printed onto the second contact pads 118 with a stencil printing process. According to an embodiment, stencil 180 has substantially vertical sidewalls with a uniform cross-section. In an additional embodiment, stencil 180 may have non-vertical sidewalls with the bottom opening being larger than the top opening. In such embodiments, the tapered sidewalls may improve the ease with which the stencil can be removed after printing. As shown in FIG. 5A, stencil 180 may be positioned above the first substrate 101 such that a gap between the bottom surface of the stencil and the top surface of the first substrate 101 is formed. According to an additional embodiment, the stencil may be in contact with the first substrate 101.

Referring now to FIG. 5B, the stencil 180 is removed to leave behind interconnects 120. Since the solder paste is a no-slump solder paste as described above, the interconnects 120 will not slump and cause shorts between neighboring interconnects 120 even though the solder paste has not been cured. According to an embodiment, the interconnects 120 may be cured after the stencil 180 has been removed. According to an embodiment, the first die 110 may be bonded to the first substrate 101 prior to curing the interconnects 120, as shown in FIG. 5C. In such embodiments, the curing process may be performed concurrently with the solder bump reflowing used to attach the first die 110 to the first substrate. By way of example, the reflowing temperature of the solder bumps 105 may be in excess of 200° C. Therefore, the temperature is also sufficient to melt the solder matrix 151 of the no-slump solder paste, and allow for the liquid phase sintering between the melted solder matrix 151 and the Cu particles 153. Accordingly, once the first die 110 has been bonded to the first substrate 101, the interconnects 120 will also have been cured, and will not reflow during subsequent bonding processes. According to an embodiment, an upper package 140 may be bonded to the top surfaces of the interconnects 120. The bonding of the upper package 140 is substantially similar to the process described with respect to FIG. 4D and as such, will not be repeated here.

Figure 6A:
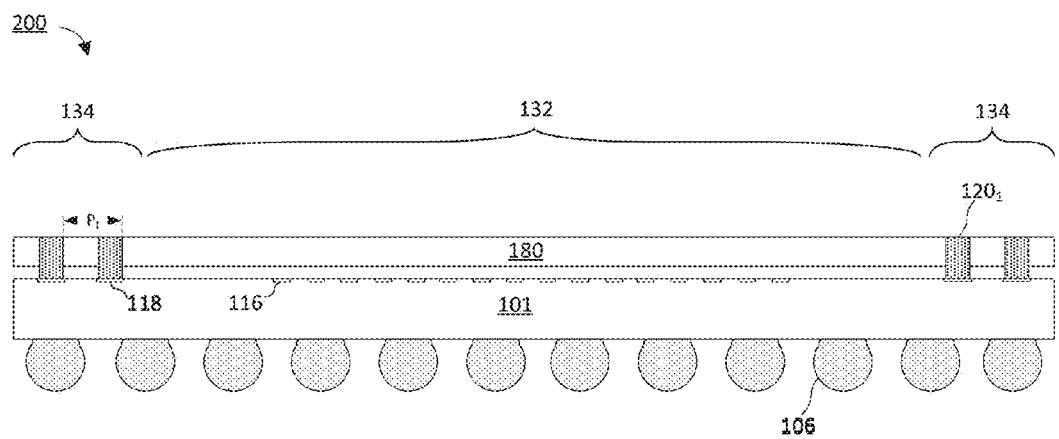
FIGS. 6A-6C illustrate cross-sectional views of a process for forming a semiconductor package according to various embodiments.
Figure 6B:
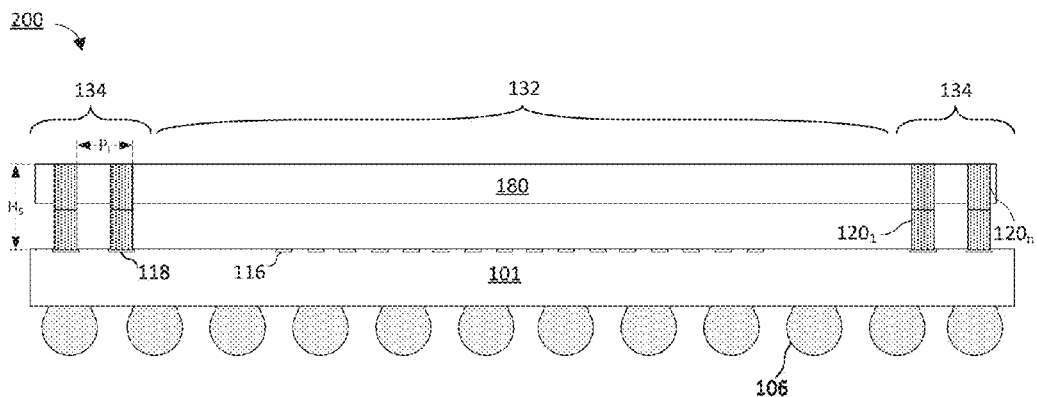

According to an additional embodiment, the interconnects 120 may be formed with multiple printing processes as shown in FIGS. 6A and 6B. In such embodiments, a first portion $120_1$ of the interconnect 120 may be formed with a first printing process, and a second portion $120_2$ of the interconnect 120 may be formed with a second printing process. According to additional embodiments, there may be three or more printing processes, each providing a portion $120_1$ through $120_n$ of the interconnect 120. By way of example, and not by way of limitation, the interconnects 120 may be formed with three or more individual printed portions, each portion contributing to the overall stand-off height $H_S$. Such embodiments allow for the use of thinner stencils. The use of a thinner stencil reduces the surface area of the stencil that contacts the no-slump solder paste, and therefore there is less friction. Accordingly, the thinner stencils allow for the stencil to be removed with greater ease.

As shown in FIG. 6A, a first portion $120_1$ of the interconnect may be printed through a stencil 180. According to an embodiment, the first portion $120_1$ may be half the desired stand-off height $H_S$. By way of example, and not by way of limitation, the first portion $120_1$ may be less than 200 µm. In an embodiment, the first portion $120_1$ may be less than 100 µm. The stencil 180 may then be removed, and a second portion $120_2$ of the interconnect 120 may be printed directly above the first portion $120_1$, as shown in FIG. 6B. The polymeric portion 152 of the no-slump solder paste improves the adhesion between the two portions and allows for secure stacking of interconnect portions prior to curing.

According to an embodiment, the same stencil 180 may be used to form both portions of the interconnects 120. According to an additional embodiment, different stencils may be used to form each portion. Using different stencils for each portion allows for each portion to be a different height. By way of example, and not by way of limitation, the first portion may have a height of approximately 150 µm and the second portion may have a height of approximately 250 µm.

According to an embodiment, a first interconnect portion $120_1$ is capable of supporting subsequent interconnect portions $120_2$ through $120_n$ in an uncured state. As such, the stacked interconnect portions $120_1$ through $120_n$ may be cured with a single curing process. In an additional embodiment, each interconnect portion $120_1$ through $120_n$ may be cured prior to forming the next interconnect portion thereon. According to an embodiment, an upper package 140 may be bonded to the top surfaces of the interconnects 120. The bonding of the upper package 140 is substantially similar to the process described with respect to FIG. 4D and as such, will not be repeated here.

Figure 6C:
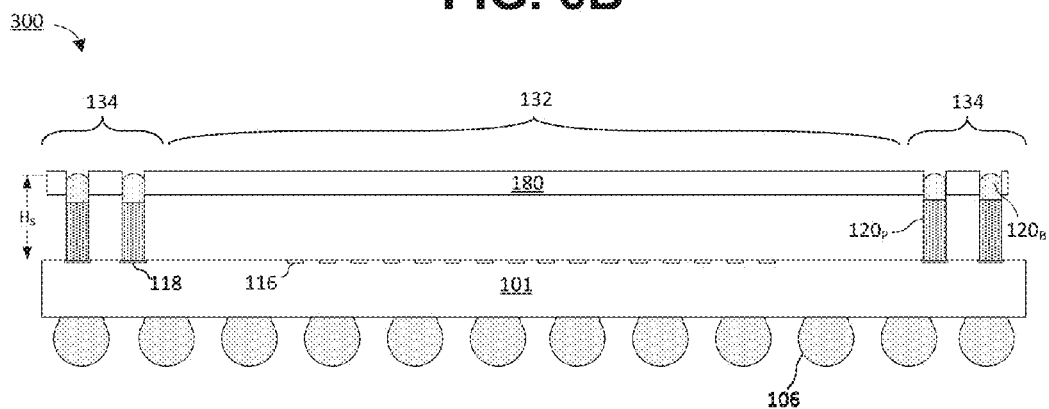

According to an additional embodiment, the multiple printing process may also be used to form interconnects 120 that include both solder bump portions $120_B$ and solder paste portions $120_P$, as shown in FIGS. 6C. According to the embodiment shown in FIG. 6C, a solder paste portion $120_P$ may be formed on the second contact pads 118 and a solder bump portion $120_B$ may then be printed directly above the solder paste portion $120_P$. As such, a portion of the stand-off height $H_S$ may be made with the solder paste portion $120_P$ and the remainder may be made with the solder bump portion $120_B$. Since the entire stand-off height $H_S$ is not obtained by the solder bump portion, the bumps do not need to have a large diameter, and therefore the pitch between them may be decreased. By way of example, and not by way of limitation, the pitch may be less than 0.3 mm. According to an embodiment, the solder bump portions may be formed from a high temperature solder, such as SnSb. In an embodiment, the solder bump material may further comprise a flux in order to improve the adhesion to the solder paste portion $120_P$ formed below. According to an embodiment, the solder paste portions $120_P$ may be printed with a stencil. After the solder paste portions $120_P$ have been formed, a second stencil may be used, to form the solder bump portions $120_B$ of the interconnects 120. According to an additional embodiment, the solder bump portions $120_B$ may be printed onto the second contact pads 118, and then the solder paste portions $120_P$ may be printed directly over the solder bump portions $120_B$.

Figure 7A:
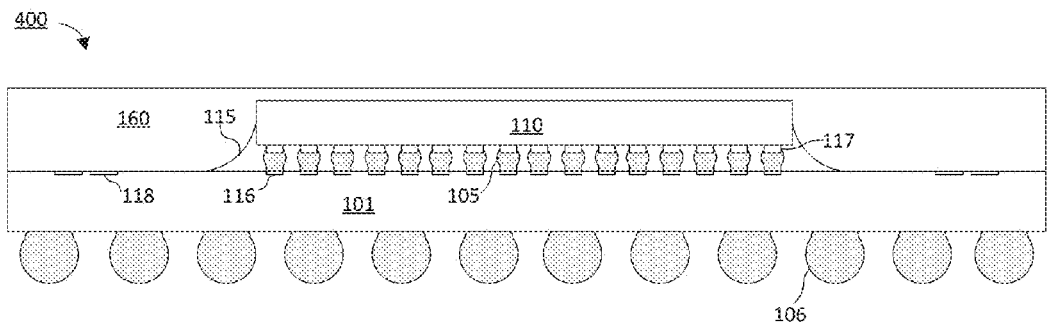
FIGS. 7A-7C illustrate cross-sectional views of a process for forming a semiconductor package according to various embodiments.
Figure 7B:
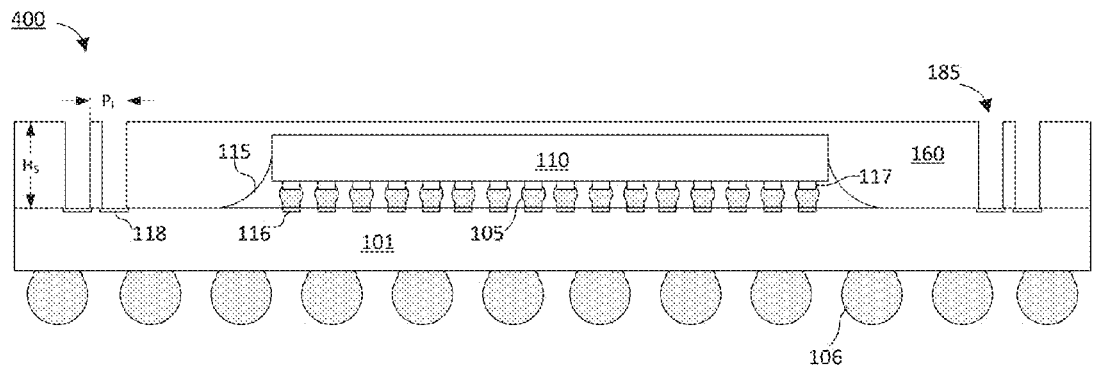
Figure 7C:
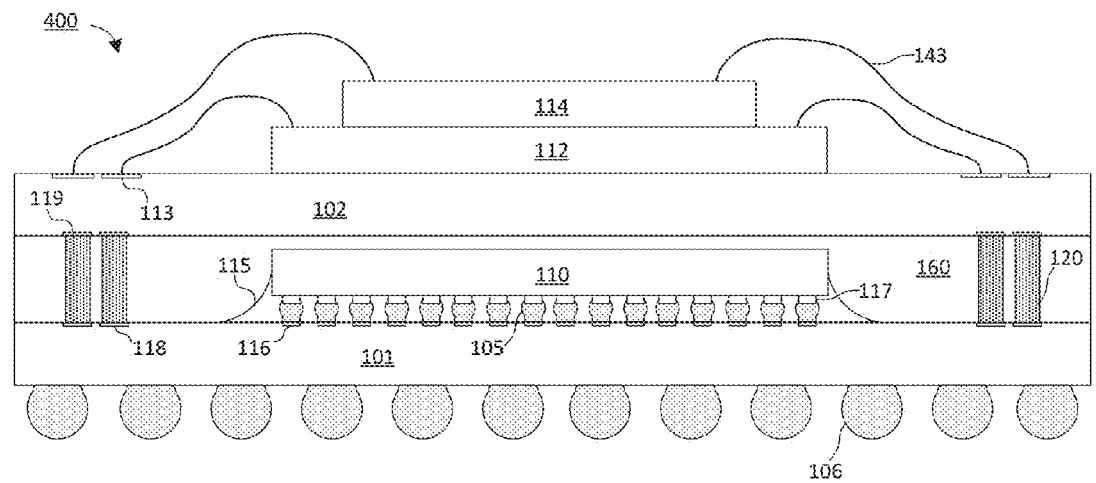

According to additional embodiments, the pitch $P_I$ of the interconnects 120 may be further reduced when a mold layer 160 is used in conjunction with the no-slump solder paste interconnects 120, as shown in FIGS. 7A-7C.

Referring now to FIG. 7A, a mold layer 160 is formed over the first substrate 101 and the first die 110. According to an embodiment, mold layer 160 may be an epoxy material. In an embodiment, mold layer 160 is made from the same material as the underfill 115 formed around solder bumps 105. In an embodiment, mold layer 160 may be approximately equal to the stand-off height $H_S$. By way of example, and not by way of limitation, mold layer 160 may be between approximately 250 μm and 400 μm thick. According to an additional embodiment, mold layer 160 may be greater than approximately 400 μm thick. As shown in FIG. 7B, through mold vias 185 are drilled into mold layer 160 to expose the second contact pads 118. By way of example, the through mold vias 185 may be drilled with a laser ablation process. The through mold vias 185 are formed with a pitch $P_I$. Due to the lateral support provided by the mold layer 160, the pitch $P_I$ may be approximately 0.1 mm or less. Furthermore, the additional lateral support provided by the mold layer 160 allows for even higher aspect ratio interconnects 120, such as 3:1 or greater. By way of example, and not by way of limitation, the stand-off height $H_S$ of the interconnects 120 may be approximately 300 μm and the width of the interconnects 120 may be approximately 80 μm. Referring now to FIG. 7C, no-slump solder paste is disposed into the through mold vias 185 to form interconnects 120. By way of example, the no-slump solder paste may be disposed with an ink jetting or stencil printing process. After the through vias 185 are filled to form interconnects 120, the no slump solder paste may be cured with a curing process substantially similar to those described above. According to an embodiment, an upper package 140 may be bonded to the top surfaces of the interconnects 120. The bonding of the upper package 140 is substantially similar to the process described with respect to FIG. 4D and as such, will not be repeated here.

Figure 8:
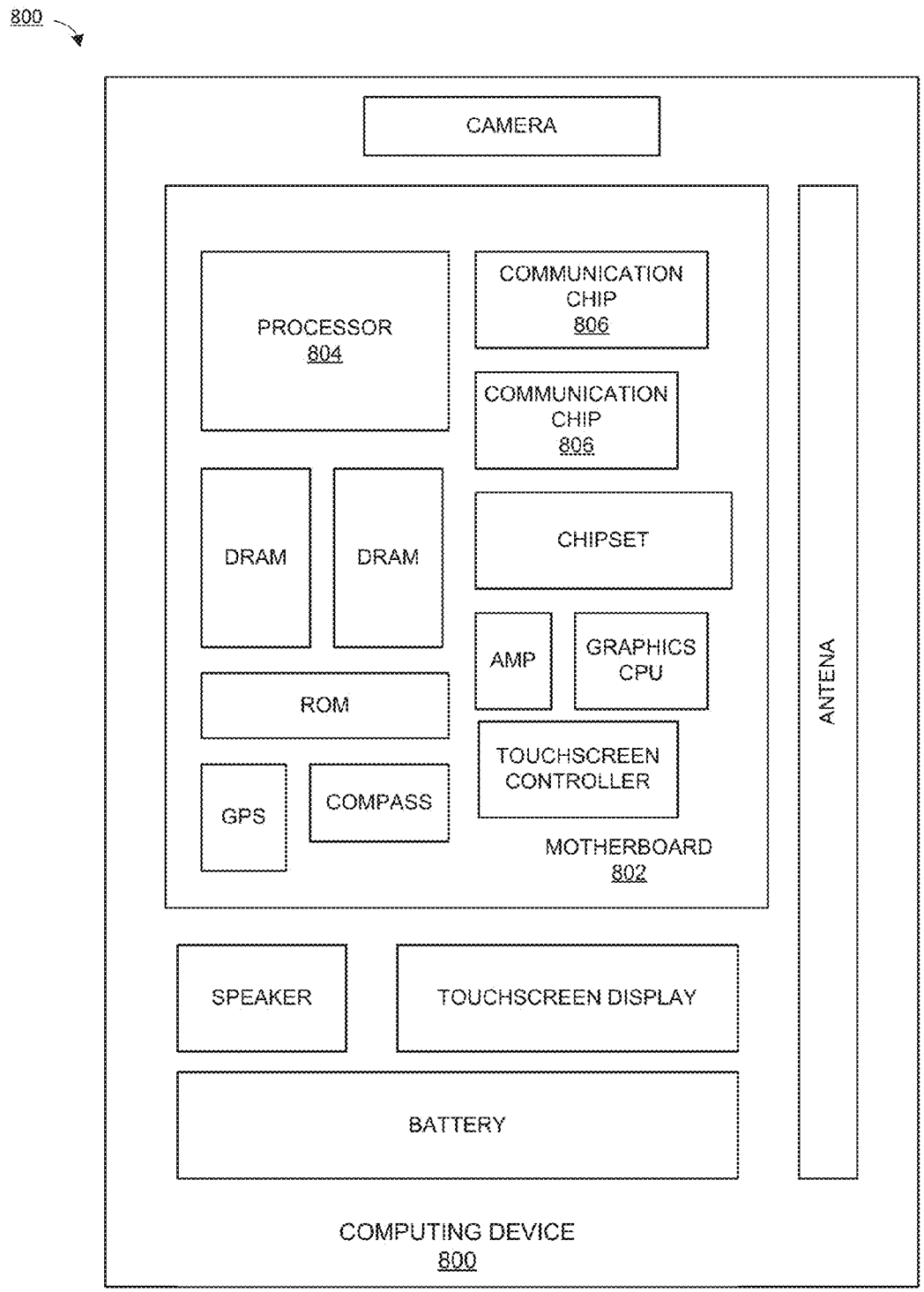
FIG. 8 illustrates a schematic diagram of a computing device that utilizes a semiconductor package according to various embodiments.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations, the processor is packaged in a semiconductor package including fine pitch high aspect ratio interconnects that provide an electrical connection between a first packaging substrate on which a die, such as the processor 804 is packaged, and a second packaging substrate, on which one or more dice are packaged, such as memory chips, in accordance with an embodiment. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In some embodiments, the communication chip 806 is packaged in a semiconductor package including fine pitch high aspect ratio interconnects that provide an electrical connection between a first packaging substrate on which a die, such as the processor 804 is packaged, and a second packaging substrate, on which one or more dice are packaged, such as memory chips, in accordance with various embodiments.

In further implementations, another component housed within the computing device 800 may contain an integrated circuit die that is packaged in a semiconductor package including fine pitch high aspect ratio interconnects that provide an electrical connection between a first packaging substrate on which a die, such as the processor 804 is packaged, and a second packaging substrate, on which one or more dice are packaged, such as memory chips built in accordance with various embodiments.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Embodiments include, a semiconductor package comprising a first substrate having a plurality of first contact pads formed on an interior region of the first substrate and a plurality of second contact pads formed on a peripheral region of the first substrate, a first device die comprising a plurality of first bonding pads, each electrically coupled to one of the first contact pads by a solder bump, and a second substrate positioned above the first device die, and having a plurality of second bonding pads, each electrically coupled to one of the second contact pads by an interconnect comprising a no-slump solder paste and having an aspect ratio of 2:1 or greater. An additional embodiment includes a semiconductor package wherein the no-slump solder paste comprises particles of a high-melting point metal, a solder matrix, and a delivery vehicle. An additional embodiment includes a semiconductor package wherein the particles of the high-melting point metal are copper particles, the solder matrix is a SnBi solder, and the delivery vehicle comprises a polymer matrix. An additional embodiment includes a semiconductor package wherein an intermetallic compound shell surrounds the copper particles. An additional embodiment includes a semiconductor package wherein the interconnects have a height greater than 400 µm. An additional embodiment includes a semiconductor package wherein the interconnects have a pitch less than 0.35 mm. An additional embodiment includes a semiconductor package further comprising a mold layer formed above the first substrate, wherein each interconnect is formed in a through mold via. An additional embodiment includes a semiconductor package wherein the interconnects have a pitch less than 0.1 mm. An additional embodiment includes a semiconductor package wherein the interconnects comprise a first portion and a second portion, wherein the first portion is bonded and electrically coupled to the second portion. An additional embodiment includes a semiconductor package wherein the first portion and the second portion are a no-slump solder paste comprising copper particles, a solder material, and a delivery vehicle. An additional embodiment includes a semiconductor package wherein the first portion is a solder bump and the second portion is a no-slump solder paste comprising copper particles, a solder material, and a delivery vehicle. An additional embodiment includes a semiconductor package wherein the first portion is a no-slump solder paste comprising copper particles, a solder material, and a polymer matrix, and the second portion is a solder bump.

Embodiments include, a method of forming a semiconductor package comprising, providing a first substrate having a plurality of first contact pads formed on an interior region of the first substrate and a plurality of second contact pads formed on a peripheral region of the first substrate, printing a no-slump solder paste onto the first substrate to form a plurality of interconnects having an aspect ratio of 2:1 or greater, wherein each interconnect is printed onto one of the second contact pads, attaching a first device die to the first substrate, wherein each of a plurality of first bonding pads on the first device die are electrically coupled to one of the first contact pads with a solder bump, and curing the no-slump solder paste. An additional embodiment includes a method of forming a semiconductor package wherein curing the no-slump solder paste comprises a liquid phase sintering process. An additional embodiment includes a method of forming a semiconductor package wherein the no-slump solder paste comprises copper particles and a SnBi solder. An additional embodiment includes a method of forming a semiconductor package wherein the interconnects are printed to a height of 400 µm or greater. An additional embodiment includes a method of forming a semiconductor package wherein the first device die is attached to the first substrate before the plurality of interconnects have been printed. An additional embodiment includes a method of forming a semiconductor package wherein printing the plurality of interconnects comprises printing a lower portion of the interconnects with a first printing process and printing an upper portion of the interconnects with a second printing process. An additional embodiment includes a method of forming a semiconductor package wherein the lower portion is a no-slump solder paste comprising copper particles, a solder material, and a polymer matrix, and the upper portion is a solder bump. An additional embodiment includes a method of forming a semiconductor package wherein attaching a first device die to the first substrate comprises reflowing the solder bumps, and wherein the reflow temperature is high enough to cure the no-slump solder paste. An additional embodiment includes a method of forming a semiconductor package further comprising, forming a mold layer over the first substrate, and forming a plurality of through mold vias through the mold layer in order to expose the second landing pads prior to printing the interconnects. An additional embodiment includes a method of forming a semiconductor package further comprising, attaching a second substrate to top surfaces of the interconnects, wherein a plurality of second bonding pads formed on the second substrate are each electrically coupled to one of the second contact pads by a interconnect.

Embodiments include a method of forming a semiconductor package comprising, providing a first substrate having a plurality of first contact pads formed on an interior region of the first substrate and a plurality of second contact pads formed on a peripheral region of the first substrate, printing a no-slump solder paste onto the first substrate to form a plurality of interconnects, wherein each interconnect is printed onto one of the second contact pads and wherein the interconnects have an aspect ratio of at least 2:1, attaching a first device die to the first substrate, wherein each of a plurality of first bonding pads on the first device die are electrically coupled to one of the first contact pads with a solder bump, curing the no-slump solder paste with a liquid phase sintering process, attaching a second substrate to top surfaces of the interconnects, wherein a plurality of second bonding pads formed on the second substrate are each electrically coupled to one of the second contact pads on the first substrate by an interconnect, and attaching a second device die to the second substrate, wherein the second device die is electrically coupled to the second contact pads. An additional embodiment includes a method of forming a semiconductor package further comprising, forming a mold layer over the first substrate, and forming a plurality of through mold vias through the mold layer in order to expose the second landing pads prior to printing the interconnects. An additional embodiment includes a method of forming a semiconductor package wherein attaching a first device die to the first substrate comprises reflowing the solder bumps, and wherein the reflow temperature is high enough to cure the no-slump solder paste.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A semiconductor package comprising:
   a first substrate having a plurality of first contact pads formed on an interior region of the first substrate and a plurality of second contact pads formed on a peripheral region of the first substrate;
   a first device die comprising a plurality of first bonding pads, each electrically coupled to one of the first contact pads by a solder bump; and
   a second substrate positioned above the first device die, and having a plurality of second bonding pads, each electrically coupled to one of the second contact pads by an interconnect comprising a no-slump solder paste and having an aspect ratio of 2:1 or greater, and wherein the no-slump solder paste comprises a conductive network formed by particles of a high-melting point metal, a solder matrix including an alloy of two or more elements, and a delivery vehicle, wherein the particles of the high-melting point metal are separated from the delivery vehicle by intermetallic compound shells that surround the high-melting point metal and are formed from the solder-matrix material and the high-melting point metal, and wherein the solder matrix forms conductive bridges between the high-melting point metal particles, and wherein each interconnect comprises unsupported sidewalls.

2. The semiconductor package of claim 1, wherein the particles of the high-melting point metal are copper particles, the solder matrix is a SnBi solder, and the delivery vehicle comprises a polymer matrix.

3. The semiconductor package of claim 1, wherein the interconnects have a height greater than 400 µm.

4. The semiconductor package of claim 1, wherein the interconnects have a pitch less than 0.35 mm.

5. The semiconductor package of claim 1, wherein the interconnects comprise a first portion and a second portion, wherein the first portion is bonded and electrically coupled to the second portion.

6. The semiconductor package of claim 5, wherein the first portion and the second portion are a no-slump solder paste comprising copper particles, a solder material, and a delivery vehicle.

7. The semiconductor package of claim 5, wherein the first portion is a solder bump and the second portion is a no-slump solder paste comprising copper particles, a solder material, and a delivery vehicle.

8. The semiconductor package of claim 5, wherein the first portion is a no-slump solder paste comprising copper particles, a solder material, and a polymer matrix, and the second portion is a solder bump.

* * * * *